United States Patent
Dockery et al.

(10) Patent No.: US 10,066,126 B2
(45) Date of Patent: Sep. 4, 2018

(54) TUNGSTEN PROCESSING SLURRY WITH CATALYST

(71) Applicant: Cabot Microelectronics Corporation, Aurora, IL (US)

(72) Inventors: Kevin P. Dockery, Aurora, IL (US); Helin Huang, Aurora, IL (US); Matthew Carnes, Chicago, IL (US); Glenn Whitener, Batavia, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 116 days.

(21) Appl. No.: 14/988,891

(22) Filed: Jan. 6, 2016

(65) Prior Publication Data

US 2017/0190936 A1   Jul. 6, 2017

(51) Int. Cl.
| | |
|---|---|
| *C09K 13/00* | (2006.01) |
| *C09G 1/02* | (2006.01) |
| *C09K 13/06* | (2006.01) |
| *C09G 1/04* | (2006.01) |
| *H01L 21/321* | (2006.01) |

(52) U.S. Cl.
CPC ............... *C09G 1/02* (2013.01); *C09G 1/04* (2013.01); *C09K 13/00* (2013.01); *C09K 13/06* (2013.01); *H01L 21/3212* (2013.01)

(58) Field of Classification Search
CPC . C09G 1/00; C09G 1/04; C09K 13/00; C09K 13/06
USPC ............................... 252/79.1, 79.4; 438/693
See application file for complete search history.

(56) References Cited

U.S. PATENT DOCUMENTS

| | | | |
|---|---|---|---|
| 5,958,288 A | 9/1999 | Mueller et al. | |
| 2002/0194789 A1 | 12/2002 | Oshima | |
| 2009/0042485 A1* | 2/2009 | Yamaguchi | C09G 1/02 451/36 |
| 2012/0313129 A1* | 12/2012 | Zettsu | H01L 51/5048 257/98 |
| 2013/0214199 A1 | 8/2013 | Park et al. | |
| 2013/0283704 A1* | 10/2013 | Yoneda | C09G 1/02 51/308 |
| 2014/0094032 A1* | 4/2014 | Yoshida | H01L 21/02024 438/693 |
| 2014/0243250 A1* | 8/2014 | Miller | C09K 3/1463 510/175 |
| 2014/0346138 A1* | 11/2014 | Oshima | C09G 1/02 216/22 |

FOREIGN PATENT DOCUMENTS

| | | |
|---|---|---|
| CN | 1384170 A | 12/2002 |
| WO | 2015096631 A1 | 7/2015 |

OTHER PUBLICATIONS

2-Aminoethylphosphoric acid; Sigma-Aldrich via http://www.sigmaaldrich.com/catalog/product/aldrich/268674?lang=en&region=US ; 4 pages; No date available.*
Hydroxyethylidene Diphosphonic Acid (HEDP), via http://www.thwater.net/01-HEDP-4.htm ; 2 pages; no date available.*
Hydroxy Group, Wikipedia; via https://en.wikipedia.org/wiki/Hydroxy_group ; 3 pages; no date available.*
Hydroxyl radica, Wikipedia; via https://en.wikipedia.org/wiki/Hydroxyl_radical ; 12 pages; no date available.*
Taiwan Intellectual Property Office, Search Report issued in connection with Taiwan Patent Application No. 106100389 dated Oct. 2, 2017.

* cited by examiner

*Primary Examiner* — Binh X Tran

(74) *Attorney, Agent, or Firm* — Thomas Omholt; Erika S. Wilson

(57) ABSTRACT

Described are compositions (e.g., slurries) useful in methods for chemical-mechanical processing (e.g. polishing or planarizing) a surface of a substrate that contains tungsten, the slurries containing abrasive particles, metal cation catalyst, phosphorus-containing zwitterionic compound, and optional ingredients such as oxidizer; also described are methods and substrates used or processed on combination with the compositions.

18 Claims, No Drawings

TUNGSTEN PROCESSING SLURRY WITH CATALYST

FIELD OF THE INVENTION

The invention relates to compositions (e.g., slurries) useful in methods for chemical-mechanical processing (e.g. polishing or planarizing) a surface of a substrate that contains tungsten, the slurries containing metal cation catalyst.

BACKGROUND

Methods, materials, and equipment useful in chemical-mechanical processing (CMP), which includes methods of polishing or planarizing a substrate, are highly varied, and are capable of being used to process a wide range of substrates having different surfaces and end uses. Substrates that are processed by CMP methods include optical products, semiconductor substrates, and other microelectronic device substrates, at any of various stages of fabrication. A wide range of CMP apparatuses, slurries, polishing pads, and methods are well known, with new products being developed on a continuing basis. Various liquid compositions (also known as polishing slurries, CMP slurries, and CMP compositions) are designed to process a surface of a semiconductor substrate when used with a pad to abrade the surface.

Particularly with advanced nodes of semiconductor processing, methods for processing surfaces that contain both tungsten and dielectric material have become especially important. In steps of preparing functioning structures from the tungsten, the substrate can begin with a discontinuous surface having patterned non-tungsten (e.g., dielectric) material having three-dimensional spaces such as channels, holes, gaps, trenches, and the like, that require filling with tungsten. The tungsten can be deposited over the discontinuous surface in a manner that not only fills the spaces, but, to ensure complete filling of the spaces, also produces a continuous layer of excess tungsten over the surface. The excess tungsten is then removed to expose a surface of the original patterned material with tungsten features deposited into the spaces between the patterned non-tungsten (e.g., dielectric) material.

An example of a substrate that has tungsten features disposed between dielectric features is the type of semiconductor substrate that includes tungsten "plug" and "interconnect" structures provided between features of dielectric material. To produce such structures, tungsten is applied over a surface that contains a patterned structure made at least in part from dielectric material, e.g., silicon oxide. The patterned dielectric surface is structured, i.e., non-planar, meaning that it includes a surface that is substantially flat or planar except for being interrupted and made discontinuous by the presence of the spaces such as channels or holes. When tungsten is applied to the structured dielectric-containing surface, the spaces are filled with the tungsten and a continuous layer of excess tungsten is formed over the surface. In a next step, the excess tungsten is removed by CMP processing to expose the underlying dielectric layer and to produce a planar surface of the tungsten disposed between the spaces of the dielectric material.

By some methods, tungsten is removed in a single step that uncovers the dielectric surface. By other methods, a "two-step" process can be used. In a first step a large portion of the excess tungsten is removed but the dielectric layer is not exposed. This step is commonly referred to as a "bulk" removal step during which a high tungsten removal rate is desired. A subsequent (second) step can be used to remove the remaining tungsten and expose the underlying dielectric and tungsten surface. This step is sometimes referred to as a "polishing" step, wherein a high tungsten removal rate may be important, but wherein other performance requirements are important too.

A polishing slurry may contain chemical ingredients selected specifically for processing a certain type of substrate, such as for polishing a tungsten-containing surface as opposed to a different surface that does not contain a metal or that contains a metal that is different from tungsten. Examples of such chemical ingredients include chemical catalysts, chemical stabilizers, inhibitors, surfactants, oxidants, and others. Each of these separate ingredients may be selected to improve desired processing of (e.g., efficient removal of) a material at a surface of a substrate. In addition, the CMP processing composition typically contains abrasive particles. The type of abrasive particles may also be selected based on the type of substrate being processed. Certain types of abrasive particles may be useful in polishing a tungsten-containing substrate surface but may not be useful for processing other CMP substrate surfaces.

Metal-containing catalysts, e.g., as provided by soluble metal-containing salts that dissociate in a liquid (e.g., aqueous) medium to produce a metal cation, have been used in CMP processes for removing tungsten from a substrate surface, in the past. The metal salt dissociates in the liquid to produce a metal cation that act as a catalyst, increasing the removal rate of tungsten, especially in the presence of an oxidizing agent. The metal cation facilitates formation of tungsten oxide at the substrate surface, which is then removed. Examples of soluble metal salts that dissolve to produce cationic metal catalyst, including iron-containing salts, are described in U.S. Pat. Nos. 5,958,288 and 5,980,775, the entireties of these documents being incorporated herein by reference. Exemplary iron cation catalyst may be provided in a CMP slurry in the form of an iron salt that is soluble in a liquid (e.g., aqueous) carrier. The salt may be a ferric (iron III) or ferrous (iron II) compound such as iron nitrate, iron sulfate, an iron halide (including fluoride, chloride, bromide, iodide, as well as perchlorates, perbromates, and periodates), or an organic iron compound such as an iron acetate, acetylacetonate, citrate, gluconate, malonate, oxalate, phthalate, succinates, etc.

Also, commonly, a stabilizer is included with the metal cation to control the amount of free metal cation in the composition, thereby deliberately subduing the effect of the catalyst to a desired degree. See, e.g., U.S. Pat. Nos. 5,980,775 and 6,068,787. The stabilizer can form a complex with the metal cation to reduce its reactivity by a desired amount. Examples of stabilizers used in past CMP slurries include phosphoric acid, phthalic acid, citric acid, malonic acid, phosphonic acid, oxalic acid, and others.

When processing a surface that includes both tungsten and non-tungsten (e.g., oxide) materials, various performance features are highly important for efficiently producing high quality processed substrates. A high removal rate for tungsten is required for good processing throughput. Also highly desirable is a high ratio of the removal rate of tungsten compared to the oxide, sometimes referred to as "tunability or "selectivity." A slurry that provides exceptional removal properties (removal rates, selectivity) of tungsten and oxide can produce processed substrates that are said to exhibit excellent "topography" (described in more detail below), which is necessary for producing high quality devices from the processed substrate. But, removal properties must be balanced with other performance factors, such as the tendency of some CMP processing chemicals to cause corrosion of tungsten, specifically, to cause corrosion of tungsten plug structures. High levels of corrosion reduce the quality of a processed substrate by increasing the level of defects in devices prepared from the substrate. High corrosion rates have been correlated to high static etch rates of a slurry.

As a more general matter, a commercial CMP slurry product should exhibit a high level of stability during preparation, extended storage, transport, and use. A stable slurry is one that does not unduly separate or settle during storage (e.g., by settling of suspended abrasive particles), does not exhibit undue particle size growth during storage, and does not exhibit undue particle size growth during use, which would increase the level of defects (especially scratches) present at a surface of a processed substrate.

A processed substrate must exhibit excellent topography. In a processed substrate having a surface made of a combination of metal and oxide materials, topography characteristics include physical phenomena referred to as "erosion" of oxide, "dishing" of the metal, and their combined effect, which is referred to as "step height." In one type of substrate surface pattern commonly referred to as a line and space (L&S) pattern, a surface includes line fields and spaces. The line fields, or patterned fields, include line arrays of metal and oxide. The line fields are distributed among fields (spaces) of continuous dielectric material. The line arrays include metal and oxide lines, such as lines of tungsten and silicon oxide, and may be of any density or size, for example alternating 1 micron-wide lines of metal and 1 micron-wide lines of oxide, i.e., a 50% 1 micron array, or alternating lines of different size or density, for example of 1 micron-wide lines of metal and 3 micron-wide lines of oxide, i.e., a 25% 1×3 micron array. The fields of continuous dielectric material, for comparison, may typically be larger in dimension, and have a surface of continuous dielectric material such as a silicon oxide, for example TEOS. An exemplary field (or "space") of continuous dielectric material can be a 100 um×100 um area.

To evaluate post-polishing pattern performance of such line and space substrates, the absolute oxide loss (material removed) that occurs at the continuous dielectric field is determined, such as by an optical method using commercially available equipment. The continuous dielectric field is used as a reference for the relative pattern measurements in the arrays. For example, a line array comprised of alternating tungsten metal and TEOS oxide lines can be measured by profilometry or AFM with respect to the continuous field oxide. Erosion is characterized as a difference in the relative height of the oxide, such as the 1 micron TEOS lines, in the line array, as compared to the continuous field oxide. A positive erosion value is interpreted as relative recess of the oxide lines as compared to the continuous field oxide. Metal dishing typically refers to the relative height of the metal lines as compared to the oxide lines in the line array. For example in the 50% 1×1 micron line array, a value of 200 Angstroms dishing is interpreted as 200 Angstrom recess of the tungsten lines relative to the oxide lines. Adding the erosion and the dishing provides the total step height, in this case from the recessed (dished tungsten) to the field oxide. Total oxide or metal loss in the array can be determined by combining the dishing and erosion values with the absolute oxide loss values determined for the continuous field.

Yet another topography defect is known as a protrusion of one feature (e.g., a metal structure) relative to an adjacent feature (e.g., an insulating structure). A protrusion can be, for example, a portion of a metal (tungsten) feature that, after CMP processing (e.g., polishing), has a height that extends (protrudes) above an upper surface of an adjacent dielectric (e.g., oxide) layer. I.e., portions of metal features of a processed substrate surface may protrude above adjacent dielectric materials. Protrusions can result in a defective product prepared from the processed substrate, and, if present, may require an extra processing step to be removed.

Preferred commercial CMP polishing processes can be effective to remove metal (e.g., tungsten) from a substrate surface that also contains non-metal (e.g., dielectric), without producing unacceptable erosion, dishing, or protrusions; without undue corrosion of metal structures; and with low levels of defects such as scratches and residue present at the processed surface. Preferred processes can exhibit a high removal rate for the metal and good selectivity of the metal relative to the non-metal material. CMP compositions useful in these processes can preferably be stable during storage.

There is ongoing need in the semiconductor processing industry for CMP slurries useful for processing (e.g., polishing) tungsten-containing substrates, that provide useful or improved performance in areas of: removal rates and selectivity in removing tungsten and oxide materials; reduced topography defects including dishing, erosion, and protrusion; and useful or advantageous (i.e., low) levels of tungsten corrosion.

SUMMARY

The following describes new and inventive slurries that can be used for processing surfaces of tungsten-containing substrates by chemical mechanical processing techniques. These slurries can be referred to as "slurry compositions," "CMP slurries," simply as a "slurry" or "composition," or the like. The novel and inventive slurries contain liquid carrier (e.g., water, organic solvent, or both), abrasive particles, metal catalyst (metal cation), and phosphorus-containing zwitterionic compound that is capable of complexing with a metal cation in the liquid carrier.

Metal cations have been used as catalysts in CMP compositions. Stabilizers that complex with the metal cation have also been used, to control the effect of the metal cation catalyst. But typical catalyst and stabilizer systems, such as those based on iron nitrate nonahydrate and malonic acid as the stabilizer, suffer deficiencies in terms of topography of a processed substrate, and a propensity toward causing corrosion of metal (e.g., tungsten) structures of the processed substrate. Tungsten processing compositions that include these commonly-used catalyst systems can exhibit specific shortcomings such as significant differences between blanket and pattern removal rates, and unpredictable pattern characteristics including protrusion of tungsten features in pattern arrays. These performance shortcomings can lead to decreased yields of processed substrates, or limited usefulness of the catalyst and stabilizer, especially in advanced processing nodes where film thicknesses and feature dimensions are reduced. With advances in integrated circuit technology, commercial CMP processing methods require high throughput while maintaining excellent pattern performance and ultimate device quality. Erosion of small features or excessive dishing of metal structures can damage devices, reducing yield. Corrosion of tungsten likewise causes defects. In tungsten buffing applications, excellent topography and low levels of corrosion can be particularly challenging to achieve, in combination, due to the requirement for both high oxide removal rates and minimal acceptable erosion of oxide features.

The present invention provides new and inventive CMP compositions that contain catalyst and stabilizer in the form of a phosphorus-containing zwitterionic compound. The new CMP compositions including the catalyst and stabilizer are capable of efficiently removing tungsten and dielectric material from a substrate, from blanket (oxide) fields and from pattern fields containing a combination of tungsten and oxide. Preferred compositions can produce excellent topography (e.g., reduced erosion, dishing, and protrusions) and a low level of corrosion with high removal rates of tungsten and oxide, and with good selectivity of the tungsten relative to the oxide.

The described new CMP slurries include catalyst in the form of a metal cation, in combination with phosphorus-containing zwitterionic compound. The phosphorus-containing zwitterionic compound may associate with the free metal cation in the slurry, e.g., form a complex of the cation and the phosphorus-containing zwitterionic compound, the zwitterionic compound acting as a ligand. Using a term common in the CMP art, the zwitterionic compound may be said to act as a stabilizer of the catalyst, reducing by a desired amount the catalytic activity of the metal cation in the CMP composition. The complex may be detected by any of a variety of known analytical techniques, such as by UV-Vis spectroscopy or by potentiometry (acid-base titration, Bjerrum method).

In some embodiments, the combination of metal cation and phosphorus-containing zwitterionic compound can be provided in a CMP composition by adding to the liquid carrier a combination of soluble metal salt (e.g., iron salt), and, separately, a phosphorus-containing zwitterionic compound. The soluble metal salt dissolves to produce a metal cation in the liquid carrier, and the metal cation and phosphorus-containing zwitterionic compound can become associated and form a complex, in situ, in the liquid carrier. According to other embodiments, the complex (the phosphorus-containing zwitterionic compound and metal cation complex) can be prepared separately from the liquid carrier, and the complex itself may be added to the slurry or liquid carrier as part of a single ingredient (as opposed to forming the complex in situ by adding a soluble metal salt ingredient and a separate phosphorus-containing zwitterionic compound ingredient). By either method, an excess molar amount (i.e., more than stoichiometric amount) of the phosphorus-containing zwitterionic compound should be included in the slurry relative to the metal cation. An excess molar amount of the phosphorus-containing zwitterionic compound, e.g., at least 3.1, 3.5, or 4 molar equivalents zwitterionic compound per mole metal cation, can be desired to provide stability of the complex in the slurry.

Past descriptions of ligand compounds as complexes with a metal cation catalyst in a CMP composition do not identify zwitterionic phosphorus-containing compounds as ligands as presently described. Previously-used ligand compounds can exhibit a variety of shortcomings when used in a CMP composition, such as incompatibility with abrasive particles or other slurry chemistry, incompatibility with certain inhibitors useful in tungsten polishing, low tungsten removal rate, or undesirably high static etch rate of tungsten. According to the present description, the use of phosphorus-containing zwitterionic compound in combination with a metal cation catalyst, e.g., iron catalyst, in a CMP composition, can result in improved CMP processing of a substrate that includes tungsten at a surface with another material such as a dielectric. In certain embodiments, the phosphorus-containing zwitterionic compound may result in desired or improved topography and high removal rates of tungsten and oxide, without a high level of corrosion.

At the same time, preferred slurries can have commercially useful stability during storage and use. Preferred compositions as described, including metal cation catalyst and phosphorus-containing zwitterionic compound, can exhibit useful or advantageous stability during storage and transport, prior to being use in a CMP process. In one respect this means that the abrasive particles in the composition do not unduly settle during an extended period of unagitated storage (e.g., at room temperature, such as at 70 degrees Fahrenheit). Abrasive particles present in the polishing composition desirably are suspended in the polishing composition, more specifically in the aqueous carrier of the polishing composition. When the abrasive particles are suspended in the polishing composition, the abrasive particles preferably are stable meaning that the properties of the particles, such as their particle size and distribution, do not change significantly over time. For example it is desirable that the secondary particle size of particles of the composition does not exhibit an increase of more than 100% over a relevant period of time, more preferably not more than 50%, still more preferably not more than 10%, e.g., or not more than 5%, the period of time being for example 1 week, 3 weeks, or 2 months (with the slurry being unagitated, at room temperature (e.g., 70 degrees Fahrenheit)).

The slurry can include any type and amount of abrasive particles that will result in useful CMP processing properties. Examples of preferred abrasive particles include colloidal silica particles, which may be charged (e.g., permanently or otherwise), uncharged, and partially agglomerated. Positively-charged silica particles may exhibit a positive charge at a surface of the particle, a positive charge at an interior of the particle, or both, e.g., a positive charge of at least 6, e.g., at least 8 millivolts. The polishing slurry can include particles that are non-agglomerated, that are agglomerated, or both, e.g., at least 30, 40, or 50 percent agglomerated particles. Other types and forms of abrasive particles may also be useful, including, e.g., metal oxide particles, ceria particles, zirconia particles, alumina particles, or others as desired. In one aspect, the invention relates to a chemical mechanical processing composition that includes: liquid carrier; abrasive particles; and catalyst that includes metal cation and zwitterionic compound capable of forming a complex in the composition with the metal cation. The zwitterionic compound includes a phosphorus-containing group having a negative charge in the composition, and a cationic group having a positive charge in the composition.

DETAILED DESCRIPTION

Described as follows are chemical mechanical processing slurries useful for CMP processing (planarization, polishing) of tungsten-containing substrates. These slurries are referred to herein as "CMP slurries," "slurries," "polishing slurries," "tungsten polishing slurries," "polishing compositions," "slurries," "compositions," and the like. The compositions include liquid carrier, abrasive particles dispersed in the liquid carrier, metal cation catalyst, and phosphorus-containing zwitterionic compound. Optionally and preferably the polishing composition may also contain additives or ingredients such as oxidant, inhibitor, pH-adjuster, among others.

The polishing composition includes catalyst that will be effective in processing (e.g., polishing) a tungsten-containing surface of a substrate by facilitating the removal of tungsten from the surface. The catalyst contains a metal, such as iron, although other metals can also be useful, e.g., Ag, Co, Cr, Mo, Mn, Nb, Ni, Os, Pd, Ru, Sn, Ti, and V. Metal catalysts generally effective to increase the removal rate of tungsten during a tungsten CMP operation are well known. Examples are described in U.S. Pat. Nos. 5,958,288 and 5,980,775. Such catalysts may be in the form of a metal cation derived from a soluble metal-containing salt that dissociates in a liquid carrier to form the metal cation and an anionic counterion. Exemplary iron-containing salts include ferric (iron III) and ferrous (iron II) compounds such as iron nitrate, iron sulfate, iron halides (including fluorides, chlorides, bromides, and iodides, as well as perchlorates, perbromates and periodates), and organic iron compounds such as iron acetates, acetylacetonates, citrates, gluconates, malonates, oxalates, phthalates, and succinates, and mixtures thereof. Alternately, metal cation may be added to a CMP composition as a cation component of a complex of the metal cation and the described phosphorus-containing zwitterionic compound or another ligand or stabilizer. This complex may be prepared separately, apart from the slurry or the liquid carrier of the slurry, and the complex may be added to the slurry or liquid carrier as a single ingredient (as opposed to forming the complex in situ by adding a soluble metal salt and phosphorus-containing zwitterionic compound).

The amount of catalyst in a polishing composition may vary depending on the presence and type of oxidizing agent (if any, see below), the chemical form of the catalyst, the structure and composition of the substrate being processed, and desired processing properties. When hydrogen peroxide (or an analog) is present as an oxidizing agent, with iron cation as the catalyst, the iron may be present in the composition in an amount sufficient to provide a range from about 0.1 to about 3000 ppm Fe based on the total weight of the composition. The polishing composition preferably includes about 1 ppm Fe or more (e.g., about 5 ppm or more, about 10 ppm or more, or about 20 ppm or more). The polishing composition preferably includes about 500 ppm Fe or less (e.g., about 200 ppm or less, about 100 ppm or less, or about 50 ppm or less). The polishing composition may thus include a range from about 1 to about 500 ppm Fe (e.g., from about 3 to about 200 ppm, from about 5 to about 100 ppm, or from about 10 to about 50 ppm).

A polishing composition as described also includes phosphorus-containing zwitterionic compound, which may act as a stabilizer to the catalyst. The phosphorus-containing zwitterionic compound may form a complex with the metal cation (e.g., iron cation). The complex of metal cation and phosphorus-containing zwitterionic compound may be added to the slurry or liquid carrier in the form of the complex. Alternately, metal cation may presented to the slurry or liquid carrier as part of a metal salt that dissociates to produce the metal cation, which forms the complex in situ, in the CMP composition. By either mode of presenting the metal cation and zwitterionic compound, and forming the complex, the phosphorus-containing zwitterionic compound may act as a ligand of the complex, effectively inhibiting the activity of the metal cation catalyst in the slurry and reducing the degree to which the metal cation leads to oxidization of tungsten at the surface of the substrate. Still, the activity of the catalyst is sufficient to allow the metal cation to exhibit a desired level of catalytic action to promote a desired (rapid) level of tungsten removal from the surface.

The complex, with a ferric or ferrous cation, may be described as having a formula:

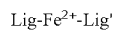

wherein Lig and Lig' may be the same or different, or

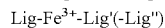

wherein Lig, Lig', and Lig" may be the same or different. Each ligand (Lig, Lig', and Lig") may be a phosphorus-containing zwitterionic compound, or a different anion effective to balance the charges of the complex. The complex in the slurry has a stability that allows the iron (or other metal) cation to interact with tungsten at a surface of a substrate to act as a catalyst during CMP processing. A number of different complexes having different ligands will be present, in equilibria, in the liquid carrier.

The phosphorus-containing compound is zwitterionic at conditions in a CMP composition, meaning that at conditions (especially pH) present in the CMP composition, e.g., during use, the phosphorus-containing compound includes a phosphorus-containing group having a negative charge, and a cationic group having a positive charge.

The phosphorus-containing zwitterionic compound may be included in a CMP composition as described in any amount useful to provide a slurry as described herein. Useful amounts of phosphorus-containing zwitterionic compound may be in a range from about 1 equivalent phosphorus-containing zwitterionic compound per catalyst metal cation, to about 3.0 equivalents phosphorus-containing zwitterionic compound per catalyst metal cation, or more. As used herein, the term "equivalent per catalyst metal cation" means one molecule of phosphorus-containing zwitterionic compound per catalyst metal cation (e.g., iron cation) in the composition.

For example, two equivalents of phosphorus-containing zwitterionic compound per catalyst metal cation means two molecules of phosphorus-containing zwitterionic compound for each metal cation present as a catalyst cation.

According to certain examples, a phosphorus-containing zwitterionic compound can include a phosphate, phosphinate, or phosphonate group, which provides the negative charge. The positive charge can be provided by any useful chemical group, with one example being a nitrogen atom of an amine group, which may be a primary, secondary, tertiary amine or a quaternary ammonium group, and which may be part of a saturated carbon chain (e.g., alkyl), which may be attached to a carbon chain, or which may be part of a saturated or unsaturated heterocyclic ring. The negative charge (e.g., at a phosphate or phosphonate group) and the positive charge (e.g., at a nitrogen atom) can be connected by a linking group that can be any useful organic group including a divalent alkylene linking group that may be substituted (e.g., by a halogen, —OH, —NH$_2$, phosphate, phosphonate, etc.), unsubstituted, branched or unbranched, saturated or unsaturated; a linking group may optionally contain one or more saturated or unsaturated ring structures wherein a ring may include a heteroatom (e.g., oxygen, nitrogen, etc.), the heteroatom optionally being a nitrogen atom that provides the cationic charge of the zwitterionic compound.

The phosphorus-containing zwitterionic compound can be a compound that includes a phosphinate, phosphonate, or phosphate group, e.g., a compound of the general formula:

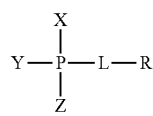

wherein at least two of X, Y, and Z are independently an oxygen groups. In certain examples, two of X, Y, and Z can be oxygen (e.g., =O), a hydroxy group, or an O-ester group, and the third of X, Y, and Z can be an organic radical. In other specific embodiments, X, Y, and Z can be oxygen or hydroxyl groups (e.g., =O, —OH, or -O⁻) or an O-ester group. At least one of X, Y, or Z is a titratable acidic group; L is an organic linking group; and R is an organic substituent containing at least one positively charged group.

Certain more specific examples of the phosphorus-containing zwitterionic compounds can have a structure according to Formula 1:

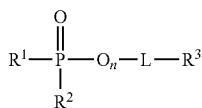

wherein: $R^1$ and $R^2$ are independently selected from a negatively-charged oxygen (-O⁻), hydroxy (—OH), an organic radical, and an organic radical connected to the phosphorus atom through a divalent oxygen, such that at least one of $R^1$ and $R^2$ is a negatively-charged oxygen providing the negative charge. Also in Formula 1, n is zero or one, L is an organic linking group, and $R^3$ is an organic substituent that provides the positive charge.

According to certain embodiments, one of $R^1$ and $R^2$ is a negatively-charged oxygen (-O⁻) that provides the negative charge to the zwitterionic compound, and the other of $R^1$ and $R^2$ is —OH, at conditions of the slurry, e.g., during use in CMP processing.

According to other embodiments, one of $R^1$ and $R^2$ is a negatively-charged oxygen (-O⁻) providing the negative charge to the zwitterionic compound at conditions of the slurry, e.g., during use in CMP processing, and the other of $R^1$ and $R^2$ includes an organic radical $R^4$ connected to the phosphorus atom through a divalent oxygen:

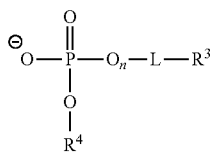

wherein $R^4$ can be any organic radical that provides a zwitterionic compound effective as described herein. Examples of $R^4$ include uncharged, substituted or unsubstituted, saturated, branched or straight, alkyl radicals. An exemplary compound is choline glycerophosphate, aka α-GPC or (2S)-2,3-Dihydroxypropyl 2-(trimethylammonio) ethyl phosphate.

Still referring to Formula 1, $R^3$ can be an amine-functional organic group that includes a nitrogen atom that is positively charged in the composition, to provide the positive charge of the zwitterionic compound. The amine-functional organic group can be any amine-containing group, such as —NH₃⁺, a quaternary ammonium, or an aromatic heterocyclic amine.

The L group can be any useful linking group, including straight, branched, and cyclic groups, saturated or unsaturated, for example a substituted or unsubstituted divalent alkylene group, optionally substituted with one or more of a hydroxy group, a phosphate group, a phosphonate group, or a combination of two or more of these. For example, L can be a divalent alkylene group (e.g., methylene, ethylene, propylene, etc.), that may optionally be substituted. Exemplary compounds include phosphocholine (aka choline phosphate, CAS 10773-3), aminoethylphosphonic acid (aka (1-Aminoethyl)phosphonic acid), alendronic acid (aka (4-Amino-1-hydroxy-1,1-butanediyl)bis(phosphonic acid)), and o-phosphorylethanolamine (2-aminoethyl dihydrogen phosphate, CAS 1071-23-4).

In other embodiments, L and $R^3$ together form an organic radical that includes one or multiple saturated or aromatic ring structures, wherein a ring structure may include a charged nitrogen atom that provides the positive (cationic) charge of the phosphorus-containing zwitterionic compound. An exemplary compound is inosine monophosphate (aka inosinic acid, IMP, 5'-inosinic acid, CAS 131-99-7).

In addition to the phosphorus-containing zwitterionic compound, which may be considered to function as a ligand of a complex with the metal cation, other compounds (sometimes referred to as "stabilizers") may also be included in the CMP composition to act as a ligand (Lig, Lig', or Lig") of the same complex. Optionally, that is, a complex may include mixed ligands including the phosphorus-containing zwitterionic compound as a ligand, and one or more additional ligand or "stabilizer" compound. Exemplary stabilizers include phosphoric acid, adipic acid, organic acids, non-zwitterionic phosphonate compounds, nitriles, carboxylic acids, and other ligands that bind to the metal cation catalyst and reduce its reactivity. The acid stabilizers may be used in their conjugate forms, e.g., a carboxylate can be used instead of a corresponding carboxylic acid. For purposes of this application the term "acid" as it is used to describe useful stabilizers also means the conjugate base of the acid stabilizer. For example the term "adipic acid" means adipic acid and its conjugate base.

Preferred stabilizers (different from the phosphorus-containing zwitterionic compound) include phosphoric acid, acetic acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid (EDTA), propylenediaminetetraacetic acid (PDTA), and mixtures thereof. Stabilizer or stabilizers (different from the phosphorus-containing zwitterionic compound), if present at all, may be included in a composition as described in an amount ranging from about 0.1 equivalent per metal (e.g., iron)-containing catalyst to about 1 or 2 equivalents per metal (e.g., iron)-containing catalyst.

The abrasive particles can be any type of abrasive particles useful in a chemical mechanical processing composition, especially for use in polishing a tungsten-containing substrate surface. Examples include various forms of: zirconia; metal oxides such as alumina; ceria; and silica; any of these may be doped, undoped, or prepared by any of various known methods for the different types of particles. Preferred abrasive particles include colloidal silica particles, such as colloidal silica particles that exhibit a positive charge in the environment of the slurry. As used herein, the term "colloidal silica particles" refers to silica particles prepared using a wet process (precipitated or condensation-polymerized silica) rather than a pyrogenic or flame hydrolysis process, which produces structurally different particles, such as fumed silica. The abrasive particles are dispersed or suspended throughout the liquid carrier. Various types of colloidal silica particles (e.g., charged, agglomerated, non-charged, non-agglomerated) are well known and available commercially.

When present in the polishing composition, colloidal silica abrasive particles can optionally exhibit a positive charge. Also when present in the polishing composition, the charged colloidal silica abrasive particles can optionally include particles that are agglomerated and particles that are non-agglomerated. Non-agglomerated particles are individual particles that may be spherical or nearly spherical in shape, but can have other shapes as well such as generally elliptical, square, or rectangular cross-sections. The non-aggregated particles are referred to as primary particles. Aggregated particles are particles in which multiple discrete primary particles, not too many in number (e.g., 2, 3, 4, or 5 primary particles), have become clustered or bonded together to form a single particle from the multiple particles, the single particle having a generally irregular shape.

Various embodiments of positively-charged and optionally agglomerated colloidal silica particles are described in Applicant's copending U.S. patent application Ser. No. 14/222,086 filed on Mar. 21, 2014, Ser. No. 14/222,736 filed on Mar. 24, 2014, and Ser. No. 14/750,204 filed on Jun. 24, 2015, and in U.S. Pat. No. 9,127,187, the entireties of these documents being incorporated herein by reference. Charged colloidal silica abrasive particles described in those patent applications may be useful in a polishing composition as presently described, and may be agglomerated or non-agglomerated.

A polishing composition as described, prior to being used in a CMP process, may include aggregated colloidal silica particles, non-aggregated colloidal silica particles, or both. Aggregated particles may be present at a level that is useful or advantageous but not excessive, i.e., at a level that does not result in a high level of defects such as scratches during CMP processing. In certain embodiments, positively-charged colloidal silica particles of a polishing composition (prior to use in a CMP process) may be partially aggregated. For example, up to 30, 40, or 50 percent of the dispersed colloidal silica particles in the polishing composition can include three or more aggregated primary particles, e.g., three, four, or five aggregated primary particles, the remainder or substantial remainder of the particles being present in the form of primary particles. The agglomerated particles are of a size and concentration that are not sufficiently high to cause a high level of defects such as scratching, during processing. For example, the agglomerated particles can mostly be agglomerated particles that contain not more than 10 primary particles; alternately stated, most of the agglomerated particles are preferably smaller than 0.5 µm (microns) (i.e., 500 nm).

The particle size of an abrasive particle is the diameter of the smallest sphere that encompasses the particle. Particles in a partially aggregated dispersion may have any suitable particle size, e.g., an average particle size (aggregate size) in a range from about 5 to about 150 nanometer (nm). The abrasive particles may have an average particle size (aggregate size) of about 20 nm or more (e.g., about 25 nm or more, about 30 nm or more, about 40 nm or more, or about 45 nm or more). The abrasive particles may have an average particle size (aggregate size) of about 100 nm or less (e.g., about 90 nm or less, about 80 nm or less, about 70 nm or less, or about 65 nm or less). Accordingly, the abrasive particles may have an average particle size (aggregate size) in a range from about 20 nm to about 90 nm (e.g., from about 25 nm to about 90 nm, or from about 30 nm to about 90 nm). Preferably, the abrasive particles can have an average particle size in a range of about 40 to about 70 nm or in a range from about 45 to about 65 nm. Particle size of colloidal silica particles may be measured using a dynamic light scattering tool such as the Zetasizer® available from Malvern Instruments® (Worcestershire, UK).

The polishing composition may include any suitable amount of abrasive particles, e.g., charged colloidal silica abrasive particles. Preferred polishing compositions may include about 0.01 weight percent or more colloidal silica (e.g., about 0.05 weight percent or more). More typically, a preferred polishing composition may include about 0.1 weight percent or more (e.g., about 1 weight percent or more, about 5 weight percent or more, about 7 weight percent or more, about 10 weight percent or more, or about 12 weight percent or more) colloidal silica particles. The amount of colloidal silica particles may be about 30 weight percent or less, and more typically about 20 weight percent or less (e.g., about 15 weight percent or less, about 10 weight percent or less, about 5 weight percent or less, about 3 weight percent or less, or about 2 weight percent or less).

Preferably, the amount of colloidal silica particles in the polishing composition can be in a range from about 0.01 weight percent to about 20 weight percent, and more preferably from about 0.05 weight percent to about 15 weight percent (e.g., from about 0.1 weight percent to about 10 weight percent, from about 0.1 weight percent to about 4 weight percent, from about 0.1 weight percent to about 3 weight percent, from about 0.1 weight percent to about 2 weight percent, or from about 0.2 weight percent to about 2 weight percent).

Examples of positively charged colloidal silica particles can exhibit a positive charge of at least 6 millivolts (mV), e.g., at least 8 millivolts, in the polishing composition. The charge on dispersed particles such as colloidal silica particles is commonly referred to as the zeta potential (or the electrokinetic potential). The zeta potential of a particle refers to the electrical potential difference between the electrical charge of the ions surrounding the particle and the electrical charge of the bulk solution of the polishing composition (e.g., the liquid carrier and any other components dissolved therein). The zeta potential is typically dependent on the pH of the aqueous medium. For a given polishing composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). The zeta potential of the polishing composition may be obtained using the Model DT-1202 Acoustic and Electro-acoustic spectrometer available from Dispersion Technologies, Inc. (Bedford Hills, N.Y.).

Exemplary colloidal silica particles may have a positive charge of about 6 mV or more (e.g., about 8 or 10 mV or more, about 15 mV or more, about 20 mV or more, about 25 mV or more, or about 30 mV or more), when in the slurry. The colloidal silica particles in the slurry may have a positive charge of about 50 mV or less (e.g., about 45 mV or less, about 40 mV or less, or about 35 mV or less). For example, the colloidal silica particles have a positive charge in a range from about 6 mV to about 50 mV (e.g., about 10 mV to about 45 mV, about 15 mV to about 40 mV, or about 20 mV to about 40 mV).

The positive charge of the colloidal silica particles may be permanent, meaning that the charge is not readily reversible, for example, by flushing, dilution, filtration, or the like. A permanent positive charge may be the result, for example, of incorporating a cationic compound onto or within the interior portion of the particle, below an outer surface of the particle. The cationic compound may include, for example, a metal cation, a nitrogen-containing compound such as an amine, a phosphonium compound, or a combination of two or more of these. A permanent positive charge may result, for example, from a covalent interaction between the particle and the cationic compound and is in contrast to a reversible positive charge that may be the result, for example, of an electrostatic interaction between the particle and the cationic compound. It will be understood that the present disclosure is not limited to any particular means of obtaining a permanent positive charge.

Notwithstanding, as used herein, a permanent positive charge of at least 6 mV (e.g., 8 mV, or higher) means that the zeta potential of the colloidal silica particles remains above 6 mV (or higher) after the following a three step filtration test. A volume of the polishing composition (e.g., 200 ml) is filtered through a Millipore Ultracell regenerated cellulose ultrafiltration disk (e.g., having a MW cutoff of 100,000 Daltons and a pore size of 6.3 nm). The remaining dispersion (the approximately 65 ml of dispersion that is retained by the ultrafiltration disk) is collected and replenished with pH adjusted deionized water. The deionized water is pH adjusted to the original pH of the polishing composition using a suitable inorganic acid such as nitric acid. This procedure is repeated for a total of three filtration cycles. The zeta-potential of the triply filtered and replenished dispersion is then measured and may be compared with the zeta potential of the original polishing composition.

While wishing to not be bound by theory, it is believed that the dispersion retained by the ultrafiltration disk (the retained dispersion) includes the silica particles and any chemical components (e.g., the positively-charged species) that may be in the particles or associated with the surface of the particles (e.g., bonded, attached, electrostatically interacting, or in contact with the particle surface). At least a portion of the liquid carrier and the chemical components dissolved therein pass through the ultrafiltration disk. Replenishing the retained dispersion to the original volume is believed to upset the equilibrium in the original polishing composition such that the chemical components associated with the particle surface may tend toward a new equilibrium. Components that are internal to the particle or are strongly associated (e.g., covalently bonded) with the particle surface remain with the particle such that there tends to be little if any change in the positive zeta potential thereof. In contrast, a portion of components that have an alternative mode of association (e.g., a reversible electrostatic interaction with the particle surface) may return to the solution as the system tends toward the new equilibrium, thereby resulting in a reduction in the positive zeta potential. Repeating this process for a total of three ultrafiltration and replenishing cycles is believed to amplify the above-described effect. It is preferred, for a charge to be permanent, that there is little difference between the zeta potential of the colloidal silica particles in the original polishing composition and the colloidal silica particles in the dispersion after the above-described three step filtration test (after correcting for ionic strength differences resulting from the filtration test). For example, it is preferred that the zeta potential of the colloidal silica particles in the original polishing composition is less than about 10 mV greater than the zeta potential of the colloidal silica particles after the three step filtration test (e.g., less than about 7 mV greater, less than about 5 mV greater, or even less than about 2 mV greater). Stated another way, it is preferred that the zeta potential of the colloidal silica particles after the three-step filtration test is less than 10 mV (or less than 7 mV, or less than 5 mV, or less than 2 mV less) less than the zeta potential of the colloidal silica particles in the original polishing composition. For example,
in an embodiment in which the zeta potential of the colloidal silica particles in the original polishing composition is 30 mV, the zeta potential of the colloidal silica particles after the three-step filtration test is preferably greater than 20 mV (or greater than 23 mV, or greater than 25 mV, or greater than 28 mV).

Colloidal silica particles and charged colloidal silica particles can be prepared by various methods, some examples of which are commercially used and known. Useful colloidal silica particles include precipitated or condensation-polymerized silica, which may be prepared using known methods, such as by methods referred to as the "sol gel" method or by silicate ion-exchange. Condensation-polymerized silica particles are often prepared by condensing $Si(OH)_4$ to form substantially spherical particles. The precursor $Si(OH)_4$ may be obtained, for example, by hydrolysis of high purity alkoxysilanes, or by acidification of aqueous silicate solutions. U.S. Pat. No. 5,230,833 describes a method for preparing colloidal silica particles in solution.

A partially aggregated dispersion in which 30 percent or more of colloidal silica particles in the dispersion include three or more aggregated primary particles may be prepared using a multi-step process in which primary particles are first grown in solution, for example as described in the '833 patent. The pH of the solution may then be adjusted to an acidic value for a predetermined time period to promote partial aggregation. An optional final step may allow for further growth of the aggregates (and any remaining primary particles). See Applicant's copending U.S. patent application Ser. No. 14/222,086, filed Mar. 21, 2014.

To provide colloidal silica particles that exhibit a positive charge, the particles may be prepared in a manner that includes placing at the particle surface, or at the particle interior, a chemical compound that is capable of exhibiting a positive charge, i.e., a cationic compound. For example, silica particles that exhibit a positive charge can be produced by placing a cationic compound at an external surface of the particles. CMP compositions that include this type of surface-charged colloidal silica abrasive particles are described, for example, in U.S. Pat. Nos. 7,994,057 and 8,252,687.

In alternate embodiments, cationic compound can be incorporated into the interior of colloidal silica abrasive particles, below an outer surface. The cationic compound may be, for example, a nitrogen-containing compound or a phosphorus-containing compound, e.g., an aminosilane or a phosphonium silane compound. Examples of such interior-charged particles are described in Applicant's copending U.S. patent application Ser. No. 14/750,204, filed Jun. 25, 2015.

When the cationic compound is a nitrogen-containing compound, it preferably includes an amine compound or an ammonium compound. When the cationic compound is a phosphorus-containing compound, it preferably includes a phosphine compound or phosphonium compound. An ammonium compound may include $R_1R_2R_3R_4N^+$ and a phosphonium compound may include $R_1R_2R_3R_4P^+$, wherein each $R_1$, $R_2$, $R_3$, and $R_4$ independently represents hydrogen, $C_1$-$C_6$ alkyl, a $C_7$-$C_{12}$ arylalkyl, or a $C_6$-$C_{10}$ aryl. These groups can be further substituted with one or more hydroxyl groups. Example ammonium compounds may include tetramethylammonium, tetraethylammonium, tetrapropylammonium, tetrabutylammonium, tetrapentylammonium, ethyltrimethylammonium, and diethyldimethylammonium. In certain embodiments, the ammonium compound is preferably not ammonia or ammonium ($NH_3$ or $NH_{4+}$). Example phosphonium compounds may include tetramethylphosphonium, tetraethylphosphonium, tetrapropylphosphonium, tetrabutylphosphonium, tetraphenylphosphonium, methyltriphenylphosphonium, ethyltriphenylphosphonium, butyltriphenylphosphonium, benzyltriphenylphosphonium, dimethyldiphenylphosphonium, hydroxymethyltriphenylphosphonium, and hydroxyethyltriphenylphosphonium. Example phosphonium compounds may also include a phosphonium silane compound.

A nitrogen-containing cationic compound may also include a substance having an amino group such as a primary amine, a secondary amine, a tertiary amine, or a quaternary amine compound. Such a nitrogen-containing cationic compound may include an amino acid, for example, an amino acid having from one to eight carbon atoms such as lycine, glutamine, glycine, iminodiacetic acid, alanine, valine, leucine, isoleucine, serine, and threonine.

Alternately the cationic compound may be an aminosilane compound. Such aminosilane compounds may include primary aminosilanes, secondary aminosilanes, tertiary aminosilanes, quaternary aminosilanes, and multi-podal (e.g., dipodal) aminosilanes. The aminosilane compound may include substantially any suitable aminosilane, for example, a propyl group-containing aminosilane, or an aminosilane compound including a propyl amine. Examples of suitable aminosilanes may include bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl trialkoxysilane, aminopropyl trialkoxysilane, (2-N-benzylaminoethyl)-3-aminopropyl trialkoxysilane), trialkoxysilyl propyl-N,N,N-trimethyl ammonium chloride, N-(trialkoxysilylethyl) benzyl-N,N,N-trimethyl ammonium chloride, (bis (methyldialkoxysilylpropyl)-N-methyl amine, bis (trialkoxysilylpropyl)urea, bis(3-(trialkoxysilyl)propyl)-ethylenediamine, bis(trialkoxysilylpropyl)amine, bis (trialkoxysilylpropyl)amine, 3-aminopropyltrialkoxysilane, N-(2-aminoethyl)-3-aminopropylmethyldialkoxysilane, N-(2-Aminoethyl)-3-aminopropyltrialkoxysilane, 3-aminopropylmethyldialkoxysilane, 3-aminopropyltrialkoxysilane, (N-trialkoxysilylpropyl)polyethyleneimine, trialkoxysilylpropyldiethylenetriamine, N-phenyl-3-aminopropyltrialkoysilane, N-(vinylbenzyl)-2-aminoethyl-3-aminopropyltrialkoxysilane hydrochloride, 4-aminobutyltrialkoxysilane, and mixtures thereof. Those of ordinary skill will readily appreciate that aminosilane compounds are commonly hydrolyzed (or partially hydrolyzed) in an aqueous medium. Thus by reciting an aminosilane compound, it will be understood that the aminosilane and/or a hydrolyzed (or partially hydrolyzed) species and/or condensed species thereof may be incorporated in the colloidal silica abrasive particles.

It will be understood that colloidal silica abrasive particles may include two or more of the above-described cationic compounds that may be: incorporated into the interiors of the particles, located at surfaces of the particles, or both. For example, in one embodiment of positively-charged colloidal silica particles, a first incorporated cationic compound may include an aminosilane compound and a second incorporated cationic compound may include an ammonium compound, such as a quaternary amine. In an embodiment in which the first cationic compound is an aminosilane compound and the second cationic compound is a quaternary amine, a molar ratio of the first cationic compound to the second cationic compound is preferably less than about 5 to 1.

By certain methods described in Applicant's copending patent application Ser. No. 14/750,204, filed Jun. 25, 2015, positively-charged colloidal silica abrasive particles may be prepared by steps that incorporate a cationic compound into the abrasive particles (i.e., the cationic compound becomes located below the surface of the particles at the interior of the particles). Colloidal silica abrasive particles having an internal cationic compound that provides a positive charge may be fabricated, for example, by growing the abrasive particles in a liquid solution containing the cationic compound such that the cationic compound becomes incorporated into at least a portion of the colloidal silica particles during growth thereof. Alternate embodiments of internal-charged colloidal silica particles may be prepared by treating a conventional colloidal silica particle with the cationic compound and then growing additional silica over the cationic compound to thereby cover the cationic compound with additional silica. While the cationic compound is incorporated internally in the colloidal silica abrasive particles, it will be understood that an amount of the cationic compound may also be at or near the particle surface such that the cationic compound is both internal to the surface and at the surface.

By one such embodiment, colloidal silica abrasive particles having an internal cationic compound may be prepared, for example, by (i) providing a liquid solution (e.g., including water at a predetermined pH) and (ii) combining the liquid solution with silica-producing compound and the cationic compound and causing colloidal silica particles to grow in the liquid solution such that a dispersion is obtained including colloidal silica particles having the cationic compound incorporated therein. The cationic compound may alternately be included in the liquid solution provided in (i). The silica-producing compound may include, for example, tetramethyl orthosilicate (TMOS), tetraethylorthosilicate (TEOS), silicic acid, an alkali or ammonium silicate, or a silicon tetrahalide. This method is similar to that disclosed in U.S. Pat. No. 8,529,787 in which TMOS is continuously added to a mother liquid including an alkali catalyst (the similarity is that a silica producing compound is combined with a liquid solution to produce colloidal silica particles).

The cationic compound may be added to the liquid solution in substantially any suitable amount sufficient to incorporate the cationic compound into the colloidal silica particles (with the particles preferably—although not necessarily—including less than weight percent of the cationic compound incorporated therein). The aqueous liquid solution may further optionally include an alkali catalyst, for example, including an ether amine, an ethylene amine, a tetraalkyl amine, an alcohol amine, or two or more of these. Suitable alkali catalysts may include an organic base catalyst such as ethylenediamine, diethylenetriamine, triethylenetetramine, ammonia, urea, monoethanolamine, diethanolamine, triethanolamine, tetramethylammonium hydroxide (TMAH), tetramethylguanidine, tetraethylammonium hydroxide, aminopropylmorpholine, hexyloxypropylamine, ethyloxypropylamine (EOPA), Jeffamine® HK-511 (polyetheramine) or combinations thereof. The alkali catalyst may alternatively or additionally include potassium hydroxide (KOH). The amount of alkali catalyst added may be selected so that the pH of the aqueous liquid solution is generally in the range from about 7 to about 14 and preferably in the range from about 9 to about 12.

The liquid solution may optionally further include colloidal silica particles that are intended to act as nucleation sites for growth of the colloidal silica. In such embodiments, the final colloidal silica may be thought of as having a core-shell structure (or a multi-layer structure) in which the core includes the colloidal silica particles originally added to the liquid solution, and the shell (the outer layer) includes the silica that is grown over the core and includes an internal cationic compound (such as an aminosilane).

By another method, positively-charged colloidal silica abrasive particles having an internal cationic compound may be prepared by (i) providing a high pH silicate solution (e.g., a sodium silicate or potassium silicate solution), (ii) processing the silicate solution to protonate the silicate anions and form silicic acid (e.g., by adding an acid to the solution or passing the solution through an ion exchange column) which in turn causes precipitation and growth of colloidal silica particles in a reaction vessel, and (iii) adding the cationic compound to the reaction vessel such that it becomes incorporated into the growing colloidal silica particles. The silicate solution preferably has a pH in the range from about 11 to about 13. The silicate solution may be passed through an ion exchange column into the reaction vessel, which tends to lower the pH to a value in a range from about 2 to about 5. The cationic compound may be added to the reaction vessel in substantially any suitable amount and at substantially any suitable rate such that a sufficient amount of the cationic compound is incorporated into the colloidal silica particles (with the particles preferably—although not necessarily—including less than 10 weight percent of the cationic compound incorporated therein).

By yet another method, positively-charged colloidal silica abrasive particles may be prepared by treating (e.g., surface treating) conventional (e.g., uncharged) colloidal silica particles with cationic compound, and then growing additional silica over the treated colloidal silica (i.e., over the cationic compound). For example, a nitrogen-containing compound such as a quaternary amine compound or an aminosilane compound may be added to a colloidal silica-containing dispersion (e.g., as taught in U.S. Pat. Nos. 7,994,057 and 8,252,687). After sufficient time to allow the nitrogen-containing compound to become associated (e.g., chemically bonded or electrostatically associated) with the colloidal silica particles, a silica producing compound such as TMOS, TEOS, silicic acid, an alkali or ammonium silicate, or a silica tetrahalide may be added to the dispersion. The dispersion may be optionally heated (e.g., to 45 degrees C.) to accelerate further growth of the colloidal silica particles such that the cationic (e.g., nitrogen-containing) compound (the surface treatment agent) becomes incorporated into the particles at the particle interiors. Such positively-charged colloidal silica particles may be thought of as having a core and multiple layers or coatings over the core: a first inner layer of the cationic compound on the core (i.e., the cationic compound-treated colloidal silica core), and an outer layer of silica deposited over the cationic compound, thereby placing the cationic compound at an interior location of the particle.

It will be understood that the above-described methods for preparing positively-charged colloidal silica particles having an internal cationic compound produce a dispersion in which the colloidal silica particles are suspended in a liquid carrier. In preparing the chemical mechanical polishing compositions herein, this dispersion may be diluted to a predetermined concentration of colloidal silica particles. Moreover, other chemical compounds may be added to the dispersion (before or after dilution) as desired. Interior-charged colloidal silica particles may have any suitable degree of aggregation prior to or at the start of their use during CMP processing, but the level of aggregation and size of aggregated particles should not result in an unsuitable level of defects during CMP processing. Before the start of CMP processing, positively-charged colloidal silica particles may be substantially non-aggregated, including mostly primary particles, and the particles may be partially aggregated. By partially aggregated it may be that 50 percent or more of the colloidal silica abrasive particles include two or more aggregated primary particles (e.g., three, four, or five aggregated particles) or that 30 percent or more (or 45 percent or more) of the colloidal silica particles include three or more (e.g., four or five) aggregated primary particles. Such partially aggregated colloidal silica abrasives may be prepared, for example, using a multi-step process in which primary particles are first grown in solution, for example as described in U.S. Pat. No. 5,230,833. The pH of the solution may then be adjusted to an acidic value for a predetermined time period to promote aggregation, for example, as described in U.S. Pat. No. 8,529,787. An optional final step may allow for further growth of the aggregates (and any remaining primary particles).

Positively-charged colloidal silica abrasive particles may further have an aggregate distribution in which 20 percent or more of the colloidal silica abrasive particles include fewer than three primary particles (i.e., non-aggregated primary particles or aggregated particles having just two primary particles, also referred to as monomers and dimers) and 50 percent or more of the colloidal silica abrasive particles includes three or more aggregated primary particles.

The polishing composition includes liquid carrier that facilitates application of the abrasive particles and chemical ingredients and additives of the polishing composition to a surface of a substrate to be processed, e.g., polished, planarized, etc. The liquid carrier may be any suitable carrier (e.g., solvent) such as a lower alcohol (e.g., methanol, ethanol, etc.), ether (e.g., dioxane, tetrahydrofuran, etc.), water, or a mixture thereof. Preferably, the liquid carrier comprises, consists essentially of, or consists of water, more preferably deionized water. A carrier that consists essentially of water can contain up to (not more than) 3, 2, 1, 0.5, 0.1, or 0.05 weight percent non-water solvent such as a lower alcohol (e.g., methanol, ethanol, etc.), ethers (e.g., dioxane, tetrahydrofuran, etc.).

The polishing composition is acidic, having a pH of less than about 7. The polishing composition typically has a pH of about 1 or more (e.g., about 2 or more, or about 3 or more). The polishing composition may have a pH of about 6 or less (e.g., about 5 or less, or about 4 or less).

The pH of the polishing composition may be achieved or maintained by any suitable means. The polishing composition may include substantially any suitable pH adjusting agents or buffering systems. For example, suitable pH adjusting agents may include nitric acid, sulfuric acid, phosphoric acid, phthalic acid, citric acid, adipic acid, oxalic acid, malonic acid, maleic acid, ammonium hydroxide, and the like, while suitable buffering agents may include phosphates, sulfates, acetates, malonates, oxalates, borates, ammonium salts, and the like. The polishing composition may optionally and preferably include oxidizing agent.

Oxidizing agent may be added to the polishing composition during the slurry manufacturing process or just prior to a CMP operation (e.g., in a tank located at a semiconductor fabrication facility). Exemplary oxidizing agents include inorganic and organic per-compounds. A per-compound as defined by Hawley's Condensed Chemical Dictionary is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-t-butyl peroxide, monopersulfates ($SO_5{=}$), dipersulfates ($S_2O_8{=}$), and sodium peroxide. Examples of compounds that contain an element in its highest oxidation state include but are not limited to periodic acid, periodate salts, perbromic acid, perbromate salts, perchloric acid, perchlorate salts, perboric acid, and perborate salts and permanganates. An often-preferred oxidizing agent is hydrogen peroxide.

Oxidizing agent may be included in a polishing composition in any useful amount, or not at all. Examples of amounts of oxidizing agent that may be useful in a slurry include amounts in a range from about 0.1 to about 10 weight percent based on total weight slurry. In certain embodiments in which a hydrogen peroxide oxidant and a soluble iron-containing catalyst are used, the oxidant may be present in the polishing composition in an amount ranging from about 0.1 to about 6 weight percent (e.g., from about 0.2 to about 5 weight percent, from about 0.3 to about 4 weight percent, or from about 0.5 to about 3 weight percent).

The polishing composition may also contain an inhibitor compound, e.g., a nitrogen-containing inhibitor compound that is effective to inhibit the conversion of solid tungsten into soluble tungsten compound, while at the same time allowing for an effective removal rate of solid tungsten during CMP processing. The inhibitor may be a selected to produce a slurry that exhibits a desired removal rate of tungsten, oxide (e.g., TEOS), or both, during polishing. The nitrogen-containing inhibitor can also be selected so that the slurry will not exhibit undue particle size growth during CMP processing, as a consequence not producing an increase in defects such as residue or scratching caused by particle growth during processing.

Classes of compounds that are useful inhibitors of tungsten etching include compounds having nitrogen-containing functional groups such as nitrogen-containing heterocycles, alkyl ammonium ions, amino alkyls, and amino acids. Useful amino alkyl corrosion inhibitors include, for example, hexylamine, tetramethyl-p-phenylene diamine, octylamine, diethylene triamine, dibutyl benzylamine, aminopropylsilanol, aminopropylsiloxane, dodecylamine, mixtures thereof, and synthetic and naturally occurring amino acids including, for example, lysine, tyrosine, glutamine, glutamic acid, cystine, glycine (aminoacetic acid).

In certain embodiments of the polishing composition the nitrogen-containing inhibitor compound may include a poly-cationic amine. Diquaternary amine compounds may include, for example, N,N'-methylenebis(dimethyltetradeclammonium bromide), 1,1,4,4-tetrabutylpiperazinediium dibromide, dimethyl-1,5-diazoniabicyclo(3.2.2)nonane dibromide, didodecyl-tetramethyl-1,4-butanediaminium diiodide, N(1),N(6)-didodecyl-N(1),N(1),N(6),N(6)-tetramethyl-1,6-hexanediaminium diiodide, or N,N,N',N',N'-pentamethyl-N-tallow-1,3-propanediammonium dichloride (CAS No. 68607-29-4).

The polishing composition may include substantially any suitable concentration of inhibitor compound. In general the concentration can be sufficiently high to provide adequate etch inhibition, but low enough so that the compound is soluble and so as not to reduce tungsten polishing rates below an acceptable level. By soluble it is meant that the amount of the inhibitor compound is fully dissolved in the liquid carrier or that it forms micelles in the liquid carrier or is to carried in micelles. It may be necessary to vary the concentration of the inhibitor compound depending upon various factors, for example, including the solubility thereof, the chemistry thereof (e.g., the number of amine groups therein, the length of an alkyl group), the relationship between etch rate inhibition and polishing rate inhibition, the type and amount of oxidizing agent used (if any), and so on. In certain desirable embodiments, the concentration of tungsten inhibitor compound in a polishing composition may be in a range from about 0.1 μM to about 10 mM (i.e., from about $10^{-7}$ to about $10^{-2}$ molar). For example, in embodiments using an amine-based polymer having a high molecular weight, the concentration may be on the lower end of the range (e.g., from about $10^{-7}$ to about $10^{-4}$ molar). In other embodiments using a comparatively simple amine compound (having fewer amine groups and a lower molecular weight), the concentration may be on the higher end of the range (e.g., from about $10^{-5}$ to about $10^{-2}$ molar).

An optional cationic compound may also be included in a CMP composition as described, including one or more cationic nitrogen-containing or phosphorus-containing compound described in Applicant's copending non-provisional patent application Ser. No. 14/924,997, filed Oct. 28, 2015, and non-provisional patent application Ser. No. 14/925,054, filed Oct. 28, 2015, these documents being incorporated herein by reference, in their entireties. Cyclodextrin can also be present, if desired, as described in non-provisional patent application Ser. No. 14/924,997.

In certain chemical mechanical polishing applications (e.g., shallow trench applications), tungsten and silicon oxide may be polished in combination with a silicon nitrogen material such as silicon nitride (SiN). In particular applications it may be desirable to achieve a high removal rate for both the silicon oxide and the silicon nitrogen material, and desired selectivity of oxide to SiN, e.g., a TEOS:SiN polishing rate selectivity less than about 15:1 and such that the TEOS and SiN polishing rates are greater than the tungsten polishing rate. The chemical mechanical polishing composition may therefore optionally further include a silicon nitrogen polishing accelerator. The silicon nitrogen polishing accelerator may include, for example, substantially any suitable poly acid such as a polycarboxylic acid, a poly phosphonic acid, or a mixture of these. Example polycarboxylic acids may include, for example, oxalic acid, malonic acid, succinic acid, glutaric acid, adipic acid, tartaric acid, sulfosuccinic acid, and phthalic acid. It will be understood that such polycarboxylic acids may generally be used in their conjugate form, e.g., the carboxylate can be used instead of the carboxylic acid. For purposes of this application the term "acid" as it is used to describe useful silicon nitrogen accelerators also means the conjugate base (or bases) of the acid.

Suitable poly phosphonic acids may include for example, methylene phosphonic acid compounds and diphosphonic acid compounds such as 1-hydroxyethylidene-1,1,-diphosphonic acid, amino tri(methylene phosphonic acid), diethylenetriamine penta(methylene phosphonic acid), and bis (hexamethylene triaminepenta(methylenephosphonic acid)). It will be understood that such poly phosphonic acids may generally be used in their conjugate form, e.g., the phosphonate can be used instead of the phosphonic acid (as described above with respect to the carboxylic acids). Suitable examples of the above-described poly phosphonic acid compounds are sold under the 30 Dequest® trade name (Italmatch Chemicals, Genova, Italy).

A polishing composition may optionally further include a uniformity additive for improving the within-wafer uniformity of the polishing rate (e.g., a wafer edge to center polishing rate ratio or difference), such as a polyethylene glycol. The polishing composition may optionally further include a biocide. The biocide may include any suitable biocide, for example an isothiazolinone biocide. The amount of biocide in the polishing composition may be in a range from about 1 ppm to about 50 ppm, and preferably from about 1 ppm to about 20 ppm.

Embodiments of the described polishing compositions may achieve a higher silicon dioxide (TEOS) polishing rate when the electrical conductivity of the polishing composition is low. Such embodiments may be advantageously used for tungsten buffing applications. Example polishing compositions may therefore advantageously have an electrical conductivity of less than 2000 µS/cm (e.g., less than 1500 µS/cm, less than 1000 µS/cm, less than 800 µS/cm, less than 500 µS/cm, or less than 400 µS/cm, or less than 300 µS/cm).

The polishing composition may be prepared using any suitable techniques and steps for combining ingredients to form a CMP slurry that contains suspended abrasive particles. Many such techniques and steps are generally known to those skilled in the semiconductor materials arts, for preparing CMP slurries. The polishing composition may be prepared in a batch or continuous process. Generally, the polishing composition may be prepared by combining the components thereof in any order. The term "component" as used herein refers to a discrete ingredient of the composition, e.g., the colloidal silica or a dispersion thereof, chemicals such as metal salt that dissociates to provide a metal cation (catalyst), the phosphorus-containing zwitterionic compound of a composition that contains it, oxidizer, liquid medium, etc.

The abrasive particles may be prepared by know methods, including methods as described herein, or may be obtained from any of a number of commercial sources. A composition (e.g., dispersion) that contains the particles in a liquid carrier may be adjusted to a desired pH. Other components such as the catalyst or an ingredient that contains catalyst, the phosphorus-containing zwitterionic compound, optional oxidizer, inhibitor, etc., may then be added and mixed by any method that is useful to uniformly incorporate those added components into the polishing composition.

By one type of method, the metal cation may be presented into the liquid carrier, and dissolved or dissociated therein, as part of a soluble metal salt (e.g., iron nitrate) that dissociates into a metal cation catalyst and an anionic counterion, in the liquid carrier. A separate ingredient in the form of phosphorus-containing zwitterionic compound may be added separately. The phosphorus-containing zwitterionic compound can associate with the metal cation, in situ, to form a complex as described herein that includes the phosphorus-containing zwitterionic compound and the metal cation.

By another method, a compound (e.g., complex) of the phosphorus-containing zwitterionic compound and metal cation can be prepared separately, apart from the slurry or the liquid carrier of the slurry, and the complex may be added to the slurry or liquid carrier as one ingredient that includes both the phosphorus-containing zwitterionic compound and the metal cation (as opposed to forming the complex in situ by adding one ingredient that includes the metal cation (e.g., a soluble metal salt), and a different ingredient that include the phosphorus-containing zwitterionic compound).

By either method, an excess molar amount (i.e., more than stoichiometric amount) of the phosphorus-containing zwitterionic compound may optionally be included in the slurry. An excess molar amount of the phosphorus-containing zwitterionic compound can be desired to provide stability of the complex in the slurry.

Oxidizing agent, if desired, may be added at any time during the preparation of the polishing composition, or prior to use in a CMP process. For example, the polishing composition without oxidizing agent may be prepared and transported or stored before use, without oxidizing agent being added. Shortly before use of the CMP composition in a CMP process, the oxidizing agent may be added, for example within about 1 minute, or within about 10 minutes, or within about 1 hour, or within about 1 day, or within about 1 week of the CMP operation. The polishing composition also may also be prepared by mixing the components just prior to contacting the surface of the substrate (e.g., on the polishing pad) during the CMP operation.

The polishing composition may be supplied as a one-package system that contains the charged colloidal silica particles, catalyst (e.g., iron-containing catalyst), phosphorus-containing zwitterionic compound, optional inhibitor, an optional oxidizer, optional biocide, water, etc. In certain other embodiments, oxidizing agent is supplied separately from all or most other components of the polishing composition and is combined, e.g., by the end-user, with the other components of the polishing composition shortly before use.

The polishing composition may advantageously be provided as a concentrate that is intended to be diluted with an appropriate amount of water, to form a "use composition" before use in CMP processing. In such an embodiment, the polishing composition concentrate may include the abrasive particles and other components in amounts such that, upon dilution of the concentrate with an appropriate amount of water, each component of the polishing composition will be present in the polishing composition in an amount within the appropriate range recited hereinabove for each component. For example, abrasive particles may be present in a concentrated composition in an amount that is about 2 times (e.g., about 3 times, about 4 times, about 5 times, or even about 10 times) greater than the concentration recited above for each component so that when the concentrate is diluted with one equal volume of water (alternately 2, 3, 4, or even 9 equal volumes of water, respectively), each component will be present in the polishing composition in an amount within the ranges set forth above.

Furthermore, as will be understood, the concentrate may contain an appropriate fraction of water present in the final polishing composition (use composition), to ensure that other components are at least partially or fully dissolved in the concentrate.

In one embodiment, a suitable concentrate includes at least 5 or 10 weight percent abrasive particles dispersed in a water based liquid carrier, along with metal cation, phosphorus-containing zwitterionic compound, optional oxidizer, inhibitor, and other ingredients. The abrasive particles may be colloidal silica particles having a permanent positive charge of at least 6, 8, or 10 mV. The pH of the composition may be in a range from about 1 to about 6, e.g., from 2 to about 5.

Although polishing compositions as described may be used to polish any type of substrate, exemplary polishing compositions can be particularly useful in polishing a substrate surface that includes at least one metal including tungsten and at least one dielectric material. The tungsten layer may be deposited over one or more barrier layers, for example titanium or titanium nitride (TiN). The dielectric layer may be a metal oxide such as a silicon oxide layer derived from tetraethylorthosilicate (TEOS), porous metal oxide, porous or non-porous carbon-doped silicon oxide, fluorine-doped silicon oxide, glass, organic polymer, fluorinated organic polymer, or any other suitable high or low-k insulating layer.

One example of a substrate that has tungsten (or another metal) features disposed between dielectric features is a semiconductor substrate that includes tungsten "plug" and "interconnect" structures provided between features of dielectric material. To produce such structures, a substrate is provided to include a structured dielectric surface. The structured dielectric surface is non-planar, meaning that it includes a surface that is substantially flat or planar except for being interrupted and made discontinuous by the presence of the spaces such as holes, channels, trenches, or the like. Tungsten is applied over the structured dielectric surface to fill the spaces with the tungsten and to produce a continuous layer of excess tungsten over the structured dielectric material. A next step is to remove the excess tungsten and also expose the underlying dielectric layer, producing a planar surface of the tungsten disposed between features of the structured dielectric material.

A polishing composition as described may be used in a polishing method that uses a chemical-mechanical polishing (CMP) apparatus. Typically, the apparatus includes a platen, which, when in use, is in motion and has a velocity that results from orbital, linear, or circular motion. A polishing pad contacts the platen and moves with the platen when in motion. A carrier holds a substrate to be polished by contacting and moving a surface of the substrate relative to a surface of the polishing pad. Processing of the substrate surface takes place by the substrate being placed in contact with the polishing pad and a polishing composition, while the polishing pad is moved relative to the substrate surface to abrade at least a portion of the substrate (such as tungsten, titanium, titanium nitride, and/or a dielectric material as described herein). The carrier provides controllable pressure on the substrate, pressing the substrate against the polishing pad. Relative motion of the substrate and pad abrades and removes material from the surface of the substrate, thereby polishing the substrate. Polishing and removal of material may be based on the combined effects of the chemical activity of the polishing composition (e.g., by catalyst, oxidizing agent, etc., present in the polishing slurry), and the mechanical activity of the abrasive particles suspended in the polishing composition.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can be constructed of any suitable polymer of desired density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

The advantages of the CMP compositions as described present invention are illustrated in the following examples, which demonstrate useful or advantageous features of inventive compositions. The Examples should not be construed as in any way limiting its scope.

Example 1

This example shows advantages of compositions that contain phosphorus-containing ligands (P-Cmpd.) of the type described herein, with regard to slurry stability, as compared to an otherwise identical slurry that contains phosphorus-containing ligand of the type known in the art. The compositions are set forth in Table 1. Silica-A is a charged colloidal silica particle having a secondary particle size of about 55 nm and a charge of ca 25 mV. It is evident from the particle size data presented in Table 2 that an inventive slurry with alendronic acid (no particle growth observed) has superior stability as compared to the otherwise identical slurry with the phosphonic acid, Dequest 2010, which had nearly 2× increase in particle size.

TABLE 1

Slurry Compositions.

| Formula ID | Type | Abr. | Abr. (%) | pH | Cat. | MA (%) | P-Cmpd. | P-Cmpd. (%) | Surfactant (%) | Beta-cyclodextrin |
|---|---|---|---|---|---|---|---|---|---|---|
| 1-A | Comp. | Silica-A | 4 | 3 | 0.004 | 0.008 | Dequest 2010 | 0.08 | 0.006 | 0.04 |
| 1-B | Inv. | Silica-A | 4 | 3 | 0.004 | 0.008 | Alendronic acid | 0.08 | 0.006 | 0.04 |

Abr. = abrasive; cat. = iron nitrate nonahydrate; MA = malonic acid; Surfactant (N,N,N',N',N'-pentamethyl-N-tallow-1,3-propanediammonium dichloride).

TABLE 2

Particle Stability

| Form. ID | Type | Initial Particle PS (µm) | Slurry PS (µm) |
|---|---|---|---|
| 1-A | Comp. | 0.06 | 0.1 |
| 1B | Inv. | 0.06 | 0.06 |

The Initial Particle size is the particle size of the ingredient particles before being combined with other ingredients of the slurry. The comparative and inventive slurries' particles sizes (Slurry PS) were measured in the slurry prepared as described, the particle size measurement being performed at a time at least 3 hours after preparation is complete, that time including no agitation of the slurry, at ambient conditions.

Example 2

This example teaches the advantages of example formulations as described with regard to etching of tungsten. The slurry preparations are set forth in Tables 3 and 4. The corresponding tungsten etching rates (45° C.) are provided in Tables 5 and 6. It is apparent from the examples that the example compositions as described (Inv.) can have significantly lower tungsten static etch rates than the comparative (Comp.) compositions. For example, the inventive slurry 3-B has 20% or less of the static etch rate of the comparison slurry 3-A, while the inventive slurry 3-C has only 70% of the observed etch rate of the comparison slurry 3-B. In the abrasive-free formulations (Table 4), the inventive slurries also have significantly lower static etch rates as compared to the comparatives. For example, the inventive composition 4B has less than 1% of the static etch rate of the comparative 4A, while the inventive composition 4C has less than 25% of the static etch rate of the comparative 4A.

TABLE 3

Formulations with Abrasive

| Formula ID | Type | Abr. | Abr. (%) | pH | Cat. (mmol) | TBAH (%) | P-containing ligand | P-containing ligand (mmol) | Isothiazolinone biocide (%) |
|---|---|---|---|---|---|---|---|---|---|
| 3-A | Comp. | Silica-B | 2 | 2.3 | 0.03 | 0.09 | Dequest 2010 | 0.24 | 0.0008 |
| 3-B | Inv. | Silica-B | 2 | 2.3 | 0.03 | 0.09 | Alendronic acid | 0.24 | 0.0008 |
| 3-C | Inv. | Silica-B | 2 | 2.3 | 0.03 | 0.09 | OPEA | 0.24 | 0.0008 |

Cat. = iron nitrate nonahydrate; TBAH = tetrabutylammoinium hydroxide. Silica B = colloidal silica with a secondary particle size of approximately 0.1 μm, obtained from Fuso Corp. OPEA = O-phosphorylethanolamine

TABLE 4

Formulations without Abrasive

| Formula ID | Type | pH | Cat. (mM) | MA (mM) | OPEA (mM) |
|---|---|---|---|---|---|
| 4-A | Comp. | 2.3 | 0.08 | 0.40 | |
| 4-B | Inv. | 2.3 | 0.08 | 0 | 0.40 |
| 4-C | Inv. | 2.3 | 0.08 | 0.3 | 0.1 |

TABLE 5

Relative Tungsten Static Etch Rates with Abrasive (SER)

| Form. ID | Type | Rel. SER |
|---|---|---|
| 3-A | Comp. | 5 |
| 3-B | Inv. | 1 |
| 3-C | Inv. | 3.5 |

TABLE 6

Relative Tungsten Static Etch Rates without Abrasive (SER)

| Form. ID | Type | Rel. SER |
|---|---|---|
| 4-A | Comp. | 136 |
| 4-B | Inv. | 1 |
| 4-C | Inv. | 33 |

Example 3

This example teaches the advantage of exemplary compositions as described with regard to tungsten removal. The slurry compositions are set forth for polishing compositions with silica abrasives (Table 7) and with alumina abrasives (Table 8). The relative tungsten removal rates, normalized with respect to a comparative for each abrasive type, are provided in Table 8. It is clear that the example inventive compositions (Inv.) have more efficient tungsten removal with significantly higher tungsten removal rates compared to the comparative (Comp.) compositions. For example, the inventive composition 7B has a 50% higher removal rate than the comparative slurry 7A. The advantage of the composition with metal salt (catalyst) combined with a zwitterionic phosphorus compound as described can be demonstrated through the relative performance of the inventive slurry 7B with the comparative (without metal salt) 7C. The inventive composition 7B has approximately 5× the tungsten removal rate of the comparative 7C. In the case of the slurries with alumina abrasives, the inventive composition 8A has nearly 2× the tungsten removal rate of the comparative 8B.

TABLE 7

Silica-Based Slurry Compositions

| Formula ID | Type | Abr. | Abr. (%) | pH | Cat. (mM) | ligand | Ligand conc. (mM) | Surf. | Amino acid | Biocide % |
|---|---|---|---|---|---|---|---|---|---|---|
| 7-A | Comp. | Silica-B | 2 | 2.3 | 0.03 | MA | 0.2 | 0.09 | 0.16 | 0.001 |
| 7-B | Inv. | Silica-B | 2 | 2.3 | 0.03 | OPEA | 0.2 | 0.09 | | 0.001 |
| 7-C | Comp. | Silica-B | 2 | 2.3 | 0 | OPEA | 0.2 | 0.09 | | 0.001 |
| 7-D | Inv. | Silica-B | 2 | 2.3 | 0.03 | OPEA | 0.2 | | | 0.001 |
| 7-E | Inv. | Silica-B | 2 | 2.3 | 0.03 | CGP | 0.2 | | | 0.001 |

Abr. = abrasive; cat. = iron nitrate nonahydrate; MA = malonic acid; Surf. = surfactant (TBAH). Amino acid = glycine, CGP = choline glycerophosphate, OPEA = O-phosphorylethanolamine. All slurries formulated with 0.5% hydrogen peroxide.

TABLE 8

Alumina-Based Slurry Compositions

| Formula ID | Type | Abr. | Abr. (%) | pH | Cat. (%) | MA (%) | OPEA (%) | Surfactant (%) | Biocide (%) |
|---|---|---|---|---|---|---|---|---|---|
| 8-A | Comp. | Alumina A | 0.2 | 2.3 | 0.03 | 0.03 | | 0.06 | 0.001 |
| 8-B | Inv. | Alumina A | 0.22 | 2.3 | 0.03 | 0.03 | 0.04 | 0.06 | 0.001 |

Abr. = abrasive; cat. = iron nitrate nonahydrate; MA = malonic acid; OPEA = O-phosphorylethanolamine; Surfactant = N,N,N',N',N'-pentamethyl-N-tallow-1,3- propanediammonium dichloride. All slurries formulated with 2% hydrogen peroxide.

TABLE 9

Relative Tungsten Removal Rates

| Form. ID | Type | Rel. W removal rate |
|---|---|---|
| 7-A | Comp. | 1 |
| 7-B | Inv. | 1.5 |
| 7-C | Comp. | 0.3 |
| 7-D | Inv. | 2.0 |
| 7-E | Inv. | 1.5 |
| 8-A | Comp | 1 |
| 8-B | Inv. | 1.9 |

Conditions for 7A to 7E, Mirra tool from Applied Materials, IC1010 Pad, 3MA3700 conditioner, 1.5 psi downforce (DF), platen speed (PS)/head speed (HS) = 100/101, slurry flow rate (SFR) = 180. Conditions for 8A and 8B, Mirra, Politex Pad, no conditioner, 1.5 psi DF, PS/HS = 103/97, SFR = 150.

Example 4

This example teaches the advantage of the inventive compositions with regard to pattern performance. The pattern wafers were commercially available line and space 2000 Ang W MIT 854 patterns (200 mm) obtained from Sylib Wafer Services (Seattle, Wash.). The pattern wafers were pre-polished with W8051, which is a commercial W-bulk product, available from Cabot Microelectronics (Aurora, Ill.), to remove the W metal to reveal the oxide/metal pattern, prior to being polished with the compositions 7-A and 7-B. The erosion of the metal lines is clearly lower with the inventive slurry 7-B. It is evident that the inventive composition (7-B) has significantly lower erosion than the comparative example (7-A), with approximately 50% of the erosion of the comparative at 0.18×0.18 um, and less than 30% of the erosion at 1×3

TABLE 10

Relative Erosion of Pattern Wafers

| Form. ID | Type | Erosion (Ang) (0.18 × 0.18 μm) | Erosion (Ang) (1 × 3 μm) |
|---|---|---|---|
| 7-A | Comp. | 199 | 239 |
| 7-B | Inv. | 103 | 66 |

Conditions for 7A and 7B, Mirra polisher, IC1010 Pad, 3MA3700 conditioner, 1.5 psi DF, PS/HS = 100/101, SFR = 180, polish time = 60 s.

The invention claimed is:

1. A chemical mechanical processing composition comprising:
   liquid carrier,
   abrasive particles,
   catalyst comprising:
      metal cation, wherein the metal cation is an iron cation present from about 10 to about 50 ppm based on the total weight of the composition, and
      zwitterionic compound capable of forming a complex in the composition with the metal cation, the zwitterionic compound comprising a phosphorus-containing group having a negative charge in the composition, and a cationic group having a positive charge in the composition, wherein the zwitterionic compound has a structure according to Formula 1:

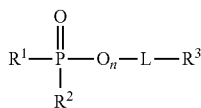

wherein:
   $R^1$ and $R^2$ are independently selected from
      a negatively-charged oxygen (—O⁻), and
      hydroxy (—OH), or
      an organic radical connected to the phosphorus atom through a divalent oxygen,
   such that at least one of $R^1$ and $R^2$ is a negatively-charged oxygen providing the negative charge;
   n is one;
   L is a linking group; and
   $R^3$ is an organic group that exhibits the positive charge.

2. A composition of claim 1 wherein the composition has a pH below 7 and the negative charge is at a phosphate, phosphinate, or phosphonate group.

3. A composition of claim 1 wherein the positive charge is at a nitrogen atom.

4. A composition of claim 1 wherein one of $R^1$ and $R^2$ is a negatively-charged oxygen providing the negative charge, and the other of $R^1$ and $R^2$ is —OH.

5. A composition of claim 1 wherein one of $R^1$ and $R^2$ is a negatively-charged oxygen providing the negative charge, and the other of $R^1$ and $R^2$ is an organic radical $R^4$ connected to the phosphorus atom through a divalent oxygen:

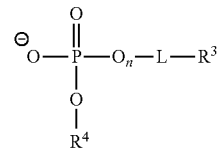

wherein $R^4$ is a substituted or unsubstituted, saturated, branched, or straight alkyl radical.

6. A composition of claim 1 wherein the zwitterionic compound is selected from: o-phosphoryl-ethanolamine, choline glycerophosphate, inosine monophosphate, phosphocholine.

7. A composition of claim 1 wherein the iron cation is derived from iron nitrate nonahydrate.

8. A composition of claim 1 comprising from about 0.5 to about 4 weight percent silica abrasive particles.

9. A composition of claim 1 wherein $R^3$ is an amine-functional organic group comprising a nitrogen atom that provides the positive charge.

10. A composition of claim 9 wherein the amine-functional organic group is selected from —NH₃⁺, a quaternary ammonium, and an aromatic heterocyclic amine.

11. A composition of claim 10 wherein the amine-functional organic group is —NH₃⁺, and L is a substituted or unsubstituted divalent alkylene.

12. A composition of claim 11 wherein L is a substituted divalent alkylene, comprising substituents selected from a hydroxy group, a phosphate group, a phosphonate group, and combinations thereof.

13. A composition of claim 1 wherein L and $R^3$ together form an organic radical that includes one or multiple saturated or aromatic ring structures.

14. A composition of claim 13 wherein the one or multiple saturated or aromatic ring structures contain a heteroatom, and wherein the heteroatom is selected from oxygen and nitrogen.

15. A composition of claim 14 wherein the organic radical includes an aromatic nitrogen-containing ring, and the nitrogen of the aromatic ring provides the positive charge.

16. A composition of claim 1 wherein the abrasive particles are colloidal silica particles.

17. A composition of claim 16 wherein the abrasive particles exhibit a positive charge of at least 6 millivolts, in the composition.

18. A composition of claim 16 wherein the abrasive particles exhibit a permanent positive charge of at least 10 5 millivolts, in the composition.

\* \* \* \* \*